United States Patent
Dhiman et al.

(10) Patent No.: US 11,193,964 B2
(45) Date of Patent: Dec. 7, 2021

(54) SYSTEM AND METHOD FOR MEASURING CHANGES IN DIELECTRIC PROPERTIES IN A STRUCTURE

(71) Applicant: Purdue Research Foundation, West Lafayette, IN (US)

(72) Inventors: Abhijeet Dhiman, West Lafayette, IN (US); Vikas Tomar, West Lafayette, IN (US); Animesh Sharma, West Lafayette, IN (US); Alexey Shashurin, West Lafayette, IN (US); Sergey O Macheret, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 11 days.

(21) Appl. No.: 16/431,370

(22) Filed: Jun. 4, 2019

(65) Prior Publication Data
US 2019/0369149 A1 Dec. 5, 2019

Related U.S. Application Data

(60) Provisional application No. 62/680,303, filed on Jun. 4, 2018.

(51) Int. Cl.
*G01R 27/26* (2006.01)
*G01L 1/10* (2006.01)
(Continued)

(52) U.S. Cl.
CPC ......... *G01R 27/2635* (2013.01); *G01K 1/024* (2013.01); *G01K 7/32* (2013.01);
(Continued)

(58) Field of Classification Search
CPC .......... B01J 2219/00; B01L 3/00; B02C 2/00; B04C 11/00; B23K 20/00; B23P 11/00;
(Continued)

(56) References Cited

U.S. PATENT DOCUMENTS

| | | | | |
|---|---|---|---|---|
| 6,875,369 | B1 * | 4/2005 | Tidrow | H01P 1/181 252/62.9 R |
| 7,307,431 | B2 * | 12/2007 | Safai | G01N 22/02 324/638 |

(Continued)

OTHER PUBLICATIONS

X. Wang, J. Guo, Y. Yao, Z. Jia, Q. Lv and R. Huang, "Study of epoxy resin composites doped with nonlinear fillers and its electrical properties," 2017 IEEE Conference on Electrical Insulation and Dielectric Phenomenon (CEIDP), Fort Worth, TX, 2017, pp. 54-57, doi: 10.1109/CEIDP.2017.8257474 (Year: 2017).*

(Continued)

*Primary Examiner* — Farhana A Hoque
*Assistant Examiner* — Joseph O Nyamogo
(74) *Attorney, Agent, or Firm* — Piroozi-IP, LLC (57) ABSTRACT

A method of determining stress within a composite structure is provided which includes coupling a sensor to a composite structure under load having embedded therein a plurality of particles, wherein the particles at room temperature are paraelectric or ferroelectric, transmitting an electromagnetic radiation to the sensor, thereby generating an electromagnetic field into the composite structure, sweeping frequency from a first frequency to a second frequency in a pulsed manner, receiving reflected power from the composite structure, determining the resonance frequency of the sensor, and translating the resonance frequency of the sensor to stress within the composite structure.

20 Claims, 9 Drawing Sheets

(51) Int. Cl.
  *G01K 11/26* (2006.01)
  *G01L 1/12* (2006.01)
  *G01K 1/024* (2021.01)
  *G01K 7/32* (2006.01)

(52) U.S. Cl.
  CPC ............... *G01K 11/26* (2013.01); *G01L 1/10* (2013.01); *G01L 1/12* (2013.01)

(58) Field of Classification Search
  CPC ..... B60C 11/00; B60G 2204/00; B60R 16/00; B60R 19/00; B62D 3/00; B63B 79/00; B63H 23/00; B64D 45/00; B82Y 5/00; B82Y 10/00; B82Y 15/00; B82Y 20/00; B82Y 30/00; B82Y 35/00; B82Y 40/00; C01B 32/00; C01P 2002/00; C01P 2004/00; C04B 35/00; C04B 41/00; C04B 2111/00; C04B 2235/00; C08K 3/00; C08L 33/00; C08L 63/00; C09D 5/00; C09D 7/00; C09K 11/00; C10M 7/00; C10M 2201/00; C10N 2030/00; C10N 2040/00; C10N 2050/00; C23C 4/00; C23C 16/00; C23C 18/00; C23C 24/00; C23C 28/00; C23F 13/00; C23F 2213/00; C25D 5/00; C30B 25/00; C30B 29/00; C30B 31/00; C30B 33/00; E21B 3/00; E21B 21/00; E21B 33/00; E21B 47/00; G01B 5/00; G01B 7/00; G01B 17/00; G01B 21/00; G01D 3/00; G01D 5/00; G01H 9/00; G01H 11/00; G01J 3/00; G01J 5/00; G01K 1/00; G01K 3/00; G01K 5/00; G01K 7/00; G01K 11/00; G01K 15/00; G01K 2219/00; G01K 11/26; G01K 1/024; G01K 7/32; G01L 1/00; G01L 5/00; G01L 9/00; G01L 21/00; G01L 1/10; G01L 1/12; G01M 3/00; G01M 5/00; G01M 13/00; G01M 15/00; G01N 3/00; G01N 5/00; G01N 9/00; G01N 17/00; G01N 21/00; G01N 22/00; G01N 23/00; G01N 24/00; G01N 25/00; G01N 27/00; G01N 29/00; G01N 31/00; G01N 33/00; G01N 2021/00; G01N 2291/00; G01P 3/00; G01Q 10/00; G01Q 60/00; G01Q 70/00; G01R 1/00; G01R 3/00; G01R 15/00; G01R 19/00; G01R 22/00; G01R 27/00; G01R 29/00; G01R 31/00; G01R 33/00; G01R 35/00; G01R 27/2635; G01S 5/00; G01S 13/00; G01V 3/00; G02B 1/00; G02B 6/00; G02B 2006/00; G02F 1/00; G02F 2/00; G02F 2001/00; G02F 2201/00; G02F 2202/00; G02F 2203/00; G03G 15/00; G03H 1/00; G03H 2001/00; G03H 2226/00; G04F 5/00; G05D 23/00; G05F 3/00; G06F 3/00; G06F 17/00; G06K 7/00; G06K 9/00; G06N 3/00; G06N 10/00; G06N 20/00; G06T 5/00; G06T 7/00; G06T 11/00; G06T 2207/00; G06T 2211/00; G07C 9/00; G08B 17/00; G08B 21/00; G08B 29/00; G09G 3/00; G09G 2300/00; G09G 2320/00; G09G 2330/00; G09G 2360/00; G09G 2370/00; G11B 9/00; G11C 11/00; G11C 13/00; G21K 1/00; H01B 3/00; H01F 1/00; H01F 17/00; H01F 27/00; H01F 2017/00; H01F 2021/00; H01L 29/00; H01L 21/00; H01L 22/00; H01L 23/00; H01L 24/00; H01L 25/00; H01L 27/00; H01L 31/00; H01L 33/00; H01L 41/00; H01L 43/00; H01L 45/00; H01L 49/00; H01L 51/00; H01L 2223/00; H01L 2224/00; H01L 2251/00; H01L 2924/00; H01L 2933/00; H01H 1/00; H01H 2001/00; H01H 2009/00; H01P 1/00; H01P 3/00; H01P 7/00; H01P 11/00; H01Q 1/00; H01Q 3/00; H01Q 9/00; H01Q 15/00; H01Q 17/00; H01Q 21/00; H01Q 25/00; H01R 4/00; H01R 9/00; H01R 12/00; H01S 3/00; H02J 1/00; H02M 1/00; H02M 3/00; H02M 7/00; H02M 2001/00; H02M 2003/00; H02P 5/00; H03B 5/00; H03B 17/00; H03B 19/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03K 3/00; H03K 17/00; H03K 19/00; H03L 7/00; H03L 2207/00; H03M 1/00; H04B 10/00; H04B 17/00; H04L 27/00; H04N 5/00; H04N 7/00; H04R 3/00; H04R 29/00; H04W 24/00; H05B 33/00; H05B 45/00; H05B 47/10; H05H 3/00; H05K 1/00; H05K 3/00; H05K 7/00; Y02A 90/00; Y02B 20/00; Y02B 70/00; Y02E 10/00; Y02P 70/00; Y10S 977/00; Y10S 277/00; Y02T 29/00; Y02T 428/00; Y02T 307/00; Y02T 436/00
  USPC ......................................................... 324/674
  See application file for complete search history.

(56) References Cited

U.S. PATENT DOCUMENTS

| 7,528,688 B2 * | 5/2009 | Srinivasan ................ H01P 1/19 333/202 |
| 8,184,035 B2 * | 5/2012 | Matsumoto ............. C09C 3/063 342/1 |
| 2018/0202990 A1 * | 7/2018 | Herzen ................ G01N 29/343 |

OTHER PUBLICATIONS

I Babu, D A van den Ende and G de With "Processing and characterization of piezoelectric 0-3 PZT/LCT/PA composites" Published Oct. 7, 2010 • 2010 IOP Publishing Ltd Journal of Physics D: Applied Physics, vol. 43, No. 42 (Year: 2010).*

Y. Ban and J. Liu, "Compact hairpin bandpass filter with silicon-based integrated passive device technology for Ka-band application," 2019, pp. 1-3, (Year: 2019).*

G. A. Samara, Pressure and Temperature Dependences of the Dielectric Properties of the Perovskites $BaTiO_3$ and $SrTiO_3$, Physical Review, 1966, 378-386, vol. 151, No. 2.

Karkari et al., A floating hairpin resonance probe technique for measuring time-resolved electron density in pulse discharge, Measurement Science and Technology, 2007, 2649-2656, vol. 18, IOP Publishing Ltd.

Xiang et al., Dielectric properties of $SrTiO_3$/POE flexible composites for microwave applications, Journal of the European Ceramic Society, 2007, 3093-3097, vol. 27, Elsevier Ltd.

Cho et al., Comparison of theoretical predictions and experimental values of the dielectric constant of epoxy/$BaTiO_3$ composite embedded capacitor films, Journal of Materials Science: Materials in Electronics, 2005, 77-84, vol. 16, Springer Science + Business Media, Inc.

(56) References Cited

OTHER PUBLICATIONS

Gogna et al., Revised formulation of electron density for partially shielded floating hairpin probe, Applied Physics Express, 2014, 096101-1-096101-4, vol. 7, The Japan Society of Applied Physics.

Haeni et al., Room-temperature ferroelectricity in strained $SrTiO_3$, Letters to Nature, 2004, 758-761. vol. 430, Nature Publishing Group.

G. A. Samara, Pressure and temperature dependence of the dielectric properties and phase transitions of the ferroelectric perovskites: $PbTiO_3$ and $BaTiO_3$, Ferroelectrics, 1971, 277-289, vol. 2, Gordon and Breach Science Publishers Ltd., Norwich, England.

Hu et al., Dielectric properties of BST/polymer composite, Journal of the European Ceramic Society, 2007, 3997-4001, vol. 27, Elsevier Ltd.

Kobayashi et al., Fabrication and dielectric properties of the $BaTiO3$—polymer nano-composite thin films, Journal of the European Ceramic Society, 2008, 117-122, vol. 28, Elsevier Ltd.

Jayasundere et al., Dielectric constant for binary piezoelectric 0-3 composites, Journal of Applied Physics, 1993, 2462-2466, vol. 73, American Institute of Physics.

Rao et al., A precise numerical prediction of effective dielectric constant for polymer-ceramic composite based on effective-medium theory, IEEE Transactions on Components and Packaging Technologies, 2000, 680-683, vol. 23, No. 4, IEEE.

R. L. Stenzel, Microwave resonator probe for localized density measurements in weakly magnetized plasmas, Review of Scientific Instruments, 1976, 603-607, vol. 47, No. 5, American Institute of Physics.

Piejak et al., The hairpin resonator: A plasma density measuring technique revisited, Journal of Applied Physics, 2004, 3785-3791, vol. 95, No. 7, American Institute of Physics.

\* cited by examiner

SYSTEM AND METHOD FOR MEASURING CHANGES IN DIELECTRIC PROPERTIES IN A STRUCTURE

CROSS-REFERENCE TO RELATED APPLICATIONS

The present patent application is related to and claims the priority benefit of U.S. Provisional Patent Application Ser. No. 62/680,303, filed Jun. 4, 2018, the contents of which are hereby incorporated by reference in its entirety into the present disclosure.

STATEMENT REGARDING GOVERNMENT FUNDING

This invention was not made with government support.

TECHNICAL FIELD

The present disclosure generally relates to sensors, and in particular, to a system and method of measuring stress and temperature in a structure by measuring the dielectric properties in the structure.

BACKGROUND

This section introduces aspects that may help facilitate a better understanding of the disclosure. Accordingly, these statements are to be read in this light and are not to be understood as admissions about what is or is not prior art.

Despite significant advances made in sensing, a significant bottleneck remains, including sensors require power and a mechanism to communicate sensed data. Incorporating sensors in composite material structures will place a huge demand on power and communication protocols. For example, an embedded sensor in a structure will require powering in order to communicate with an external interrogation unit. However, such powering is cumbersome since typically wireless powering can only be accomplished for extremely small distances between the powering device and the sensor, and typically that distance is made up of air. In many applications, it is necessary to monitor stresses and temperatures deep within a structure. Wireless communication suffers from the same shortcomings as the aforementioned wireless powering. Alternatively, providing wired terminals for powering and communication is also problematic since such terminals are prone to corrosion and are costly. Therefore, embedding a sensor in a structure in most applications is unpracticable. Additionally, embedded sensors in structures and materials cannot be replaced or updated easily. Without such monitoring, the structures are prone to gradual and/or catastrophic failure.

Therefore, there is an unmet need for a novel approach that monitors stress and temperature within a structure, that allows easy and effective replacement of sensors and which does not result in an excessive power usage overhead.

SUMMARY

A method of determining stress within a composite structure is disclosed. The method includes coupling a sensor to a composite structure under load having embedded therein a plurality of particles. The particles at room temperature are paraelectric or ferroelectric. The method further includes transmitting an electromagnetic radiation to the sensor, thereby generating an electromagnetic field into the composite structure. Additionally the method includes sweeping frequency from a first frequency to a second frequency in a pulsed manner. Furthermore, the method includes receiving reflected power from the composite structure. The method also includes determining the resonance frequency of the sensor. Further, the method includes translating the resonance frequency of the sensor to stress within the composite structure.

A system for predicting stress within a composite structure is also disclosed. The system includes an electromagnetic interrogation unit. The electromagnetic interrogation unit includes an electromagnetic transmitter. The electromagnetic transmitter provides electromagnetic radiation by sweeping frequency from a first frequency to a second frequency in a pulsed manner. The electromagnetic interrogation unit also includes a resonance sensor. The resonator sensor receives the transmitted electromagnetic radiation and conveys the received electromagnetic radiation into the composite structure under load, where the composite structure has embedded therein a plurality of particles, wherein the particles at room temperature are paraelectric or ferroelectric. The system also includes an electromagnetic analysis unit. The electromagnetic analysis unit is configured to i) receive reflected power from the composite, ii) determine the resonance frequency of the sensor, and iii) translate the resonance frequency of the sensor to stress within the composite structure.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

Novel approaches and arrangements that monitor stress and temperature within a structure, that allows easy and effective replacement of sensors and which do not result in an excessive power usage overhead are provided in the present disclosure. Applications for such an arrangement include, energetic materials, batteries, close packed munitions, structures, vehicles, etc. A passive sensor arrangement is disclosed that will (A) remain viable for life-time of the structure and can supply material and structure health information on demand and (B) require zero or minimal energy and communication cost. Such sensing capability will be useful to many other market applications that require passive intrinsic sensing without power and need for a communications module e.g. smart energy fabrics that will derive power from environment requiring no external power and adjust temperatures adaptively, smart buildings etc.

Composites have better strength to weight ratio compared to metals which make them superior alternatives in commercial industry as well as research industry. The flexible manufacturing process of composites provides further possibility to introduce desired properties to the material by strategically embedding particles of required properties. The dispersion of fillers inside the composite matrix provides further opportunities to introduce micron-size sensors inside a matrix that represents the composite material to obtain information about stress and temperature nearby a sensor. As a result, the change in dielectric properties of this material can be detected by elastic scattering of microwave by particles or using hairpin resonator.

Composite structures can be designed and produced using unidirectional tows as reinforcement in soft polymers such as thermoplastic elastomers (TPE), copolymers, etc., for applications that could benefit from the synergetic combination of both the materials. Adding embedded sensing elements that are incorporated into the polymer, provides a novel material adapted to provide additional sensing functionality utilizing external sensors. This multifunctional composite material can then be formed into skeletal structures—where the primary reinforcing fibers are purposefully placed along targeted load paths in the structure—to provide primary load bearing reinforcements manufactured with automated methods capable of producing parts at economically attractive production rates.

Figure 1:
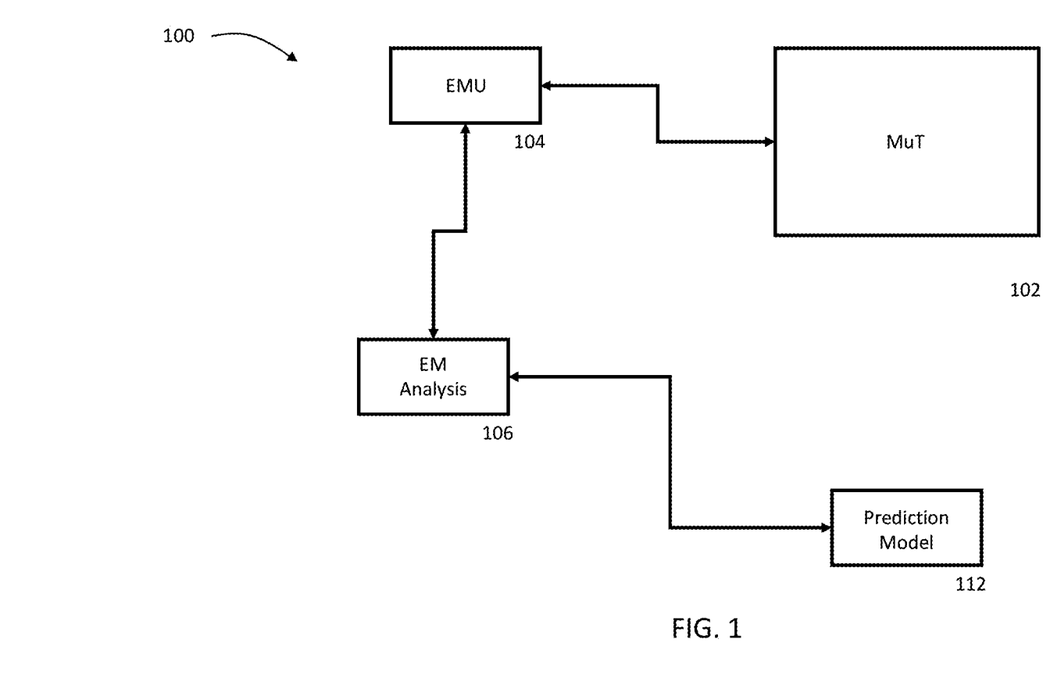
FIG. 1 is a schematic chart of a novel system of the present disclosure provided for producing a prediction model for health of a material under test.

Referring to FIG. 1, a schematic chart of a novel system 100 of the present disclosure is provided for producing a prediction model for health of a material under test. The system 100 includes an electromagnetic interrogating unit (EMU) 104 that interfaces with a material under test (MuT) 102 (also referred herein as composite structure). The EMU 104 includes various components that enable electromagnetic analysis of the MuT 102 and thereby generate an electromagnetic analysis output as represented by the block 106. The EMU 104 provides prediction of stress inside a structure (i.e., MuT 102) using resonance frequency from one or more hair-pin resonators placed on the structure to be analyzed, via the EM analysis as shown by the block 112.

To enable electromagnetic interrogation of a structure, according to the present disclosure two different aspects are of importance. First, inclusion of nano and micro—level particles in a composite material under test, as shown below, allows detection of stress by measuring change in the dielectric parameters of the composite. Second, a special resonator can be used to perform the electromagnetic interrogation.

Embedded Sensing Particles

Strontium Titanate ($SrTiO_3$), Barium Titanate ($BaTiO_3$) and Lead Titanate ($PbTiO_3$) are increasingly used in the electronic industry for applications ranging from capacitors, antennas, phase shifters, tunable filters and other devices. Above 108 K temperature, $SrTiO_3$ exists in cubic perovskite structure and exhibits paraelectric properties while Barium Titanate and Lead Titanate are ferroelectric. Thus, $SrTiO_3$ ceramic particles (or $BaTiO_3$ or $PbTiO_3$) are advantageously used according to the present disclosure to detect stress inside composite structure by measuring a change in the dielectric behavior. The addition of $SrTiO_3$ particles to composites not only enhance the mechanical properties due to high elastic modulus of $SrTiO_3$ but also allows non-destructive sensing of stress by characterizing change in dielectric constant.

Through numerical modeling it is known that dielectric properties of composite material depend on various parameters such as dielectric properties of constituent materials, volumetric fractions, particle-particle interaction etc. In particular, according to the Lichtenecker's mixing rule can be used to predict dielectric constant of a two-phase dielectric composite. The Lichtenecker's mixing rule provides:

$$\varepsilon_{eff} = \varepsilon_p^v \cdot \varepsilon_m^{1-v} \tag{1}$$

where $\varepsilon_{eff}$ is effective dielectric constant of composite,
$\varepsilon_p$ is dielectric constant of particles,
$\varepsilon_m$ is dielectric constant of epoxy resin matrix, and
$v$ is volumetric fraction of dielectric particles. These parameters have dependency on stress and hence effective dielectric constant of composite changes by application of stress. That is, the dielectric constant of composite material can change due to change in dielectric properties of filler material under stress, change in local volumetric concentration due to strains, change in particle-particle interaction, etc.

Resonator

Figure 2:
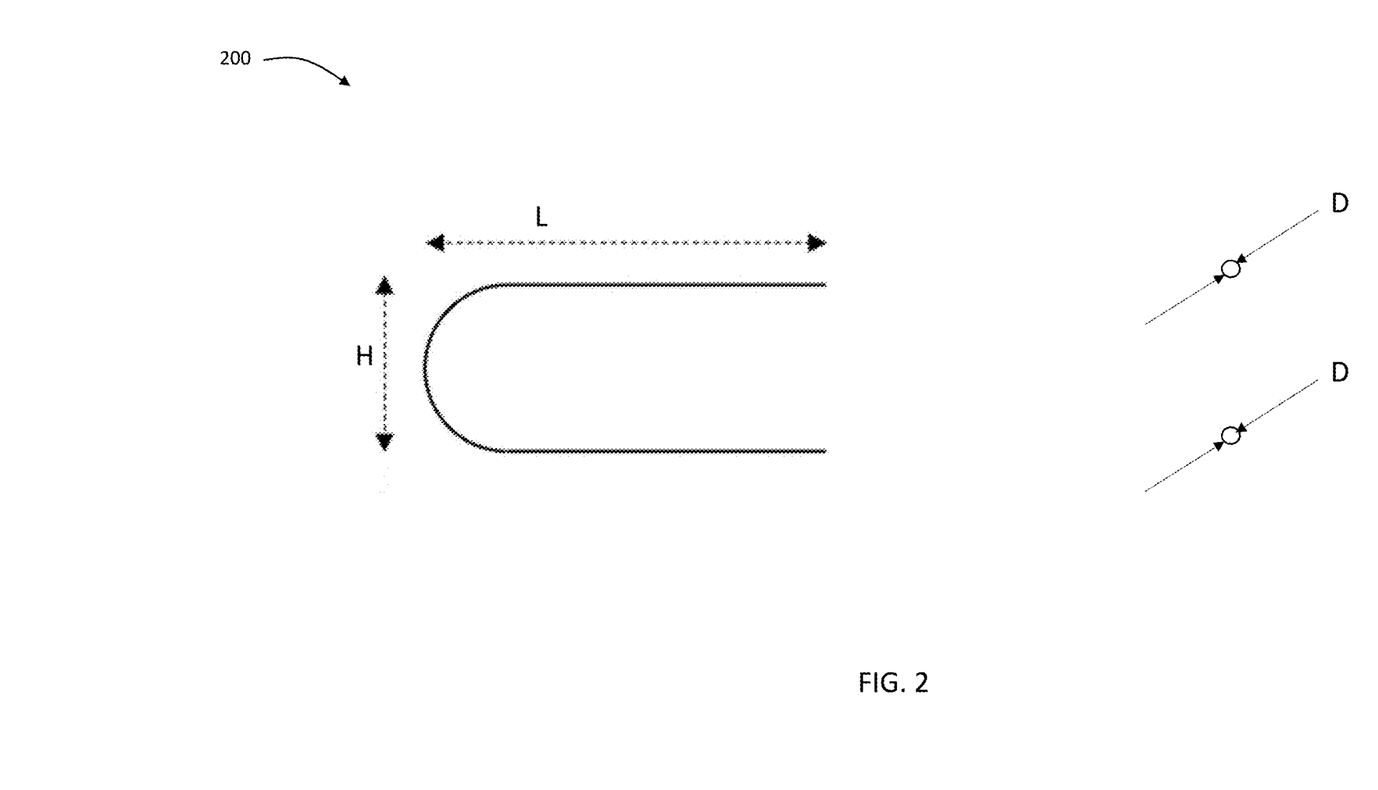
FIG. 2 is a schematic of a hairpin resonator, according to the present disclosure, where the left panel shows a top view and the right panel shows a cross-sectional view of the resonator.

A resonator is used according to the present disclosure to enable electromagnetic interrogation of a structure with embedded sensing particles. According to one embodiment, a hairpin resonator is used. A hairpin resonator 200 is a quarter-wavelength-long segment of two-wire transmission line open on one end and closed on the other end as shown in FIG. 2 (the left panel shows a top view and the right panel shows a cross-sectional view). The length of the hairpin resonator is L and the cross sectional diameter is D. In one exemplary embodiment, L is chosen to about 8.5±about 0.05 mm and D is chosen to be about 150 μm. When a source generating a microwave (MW) signal is placed near the shorted end of the resonator, maximum transfer of power is realized when the frequency of the AC signal is at the resonance frequency of the hairpin resonator. The resonance is achieved when equivalent wavelength in the medium equals four times the length of resonator and is given by equation (2), below:

$$f_r = \frac{c}{\left(4L\sqrt{\varepsilon}\right)} \tag{2}$$

where c is speed of light,
L is the length of resonator, and
ε is effective dielectric constant of medium surrounding the resonator. While two approaches for detection of resonance in the hairpin resonators can be used (transmission type—where two magnetic coupling loops are used, one for excitation of the resonator and one for detection, and reflection type—where one loop is used and reflected signal is being detected), according to the present disclosure a system with single magnetic coupling loop is used (reflection type).

Figure 3:
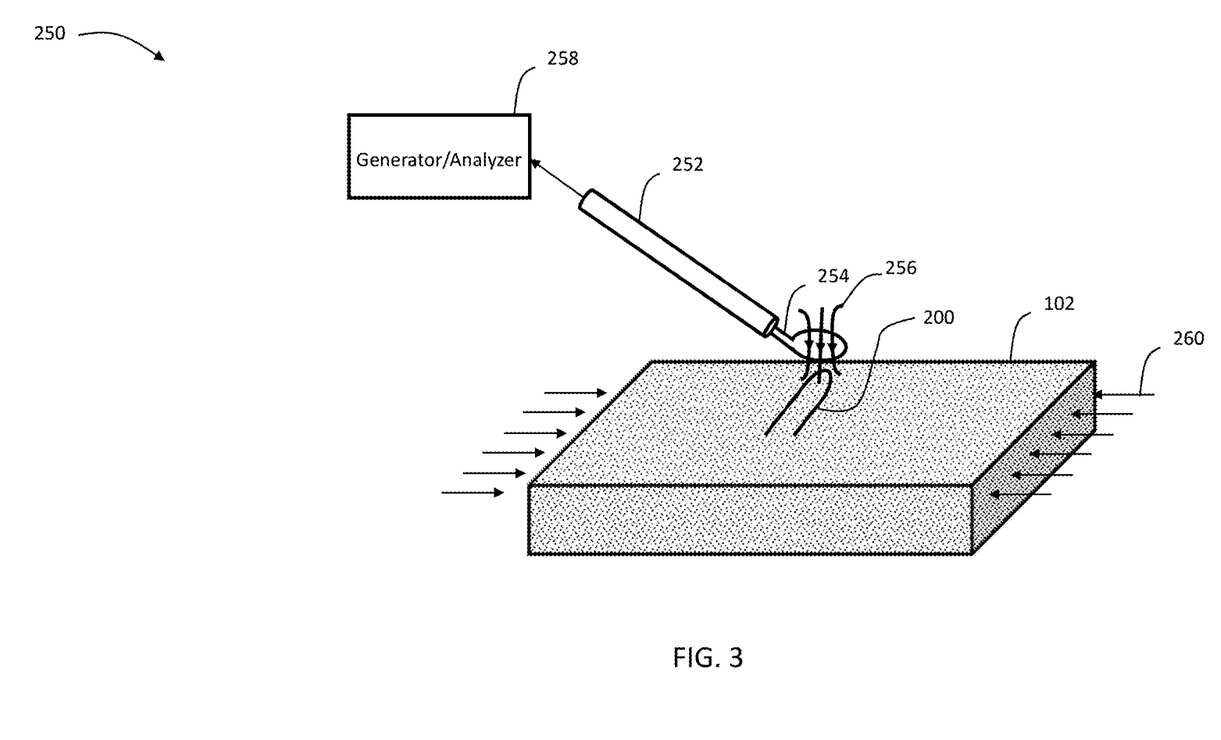
FIG. 3 is a schematic of a test setup for determining stress within a structure including a frequency generator and a hairpin resonator.

In order to test the resonator and the composite structure, the hairpin resonator 200 was placed on the surface of a composite structure 102, as shown in FIG. 3. A MW excitation signal which is a time-varying electromagnetic field in microwave range (i.e., 1-10 GHz) was used from a generator/analyzer 258 adapted to first excite and then interrogate a response from the composite structure 102. The MW signal couples to the resonator by a magnetic coupling loop 254 having an electromagnetic insulator 252 (e.g., a coaxial cable) placed about the shorted end of the resonator 200. As the MW signal passes through the resonator 200, it produces an electromagnetic field in vicinity of resonator. The stress applied to composite material changes the interaction of dielectric particles with the electromagnetic field which results into a shift of resonance frequency of the hairpin resonator 200. To determine the resonance frequency of the hairpin resonator 200, frequency from the generator/analyzer 258 is swept. As a result, the resonance frequency was determined from a trace on the generator/analyzer 258 where maximum power is absorbed by the hairpin resonator 258 at resonance. Referring to FIG. 3, an example of the generator/analyzer 258 is E8361A PNA NETWORK ANALYZER FROM AGILENT TECHNOLOGIES which is used to generate the MW pulsed signal and to detect the phase-shifted signal. The hairpin resonator 200 was placed on the surface of the composite structure 102 and pressure (shown as 260) was applied by a loading stage having a maximum capacity of 2 kN in a manner perpendicular to the length of resonator. This configuration advantageously allows introduction of stress in composite structure 102 without deforming the resonator 200. The electromagnetic insulator 252 (e.g., the coaxial cable) carries microwave signal of −10 dBm from Port 1 of the generator/analyzer 258 to the magnetic coupling loop 254. The magnetic coupling loop 254 is an antenna of 2 mm diameter soldered to the center and outer conductor of the electromagnetic insulator 252. The electromagnetic energy (shown as 256) is absorbed by the hairpin resonator 200 through electromagnetic induction between magnetic coupling loop 254 and the shorted end of the resonator 200.

Figure 4:
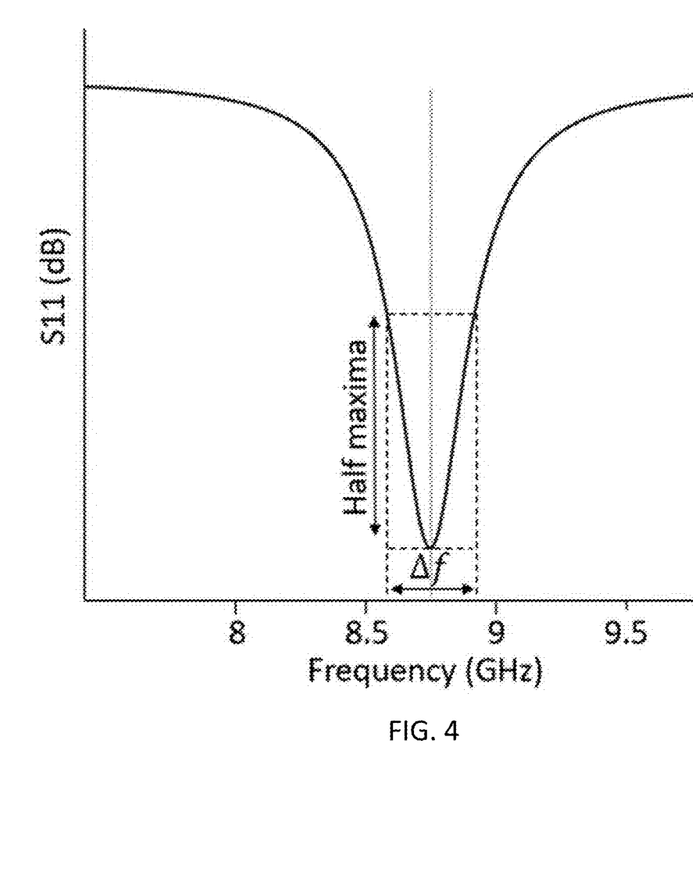
FIG. 4 is a graph of response signal vs. frequency read from the hairpin resonator of FIG. 3.

As the generator/analyzer 258 sweeps a range of frequencies, the analyzer portion of the generator/analyzer 258 detects a signal S11 as shown in FIG. 4, which is a graph of the response signal vs. frequency. When frequency of input signal reaches resonance frequency, S11 trace shows a sharp dip due to maximum power coupling between the hairpin resonator 200 and the magnetic coupling loop 254. A quality factor (Q-factor, provided below) of resonance can be defined as a ratio of resonance frequency to bandwidth (full width at half maximum).

$$Q = \frac{fr}{\Delta f_{FWHM}} \quad (3)$$

Figure 5:
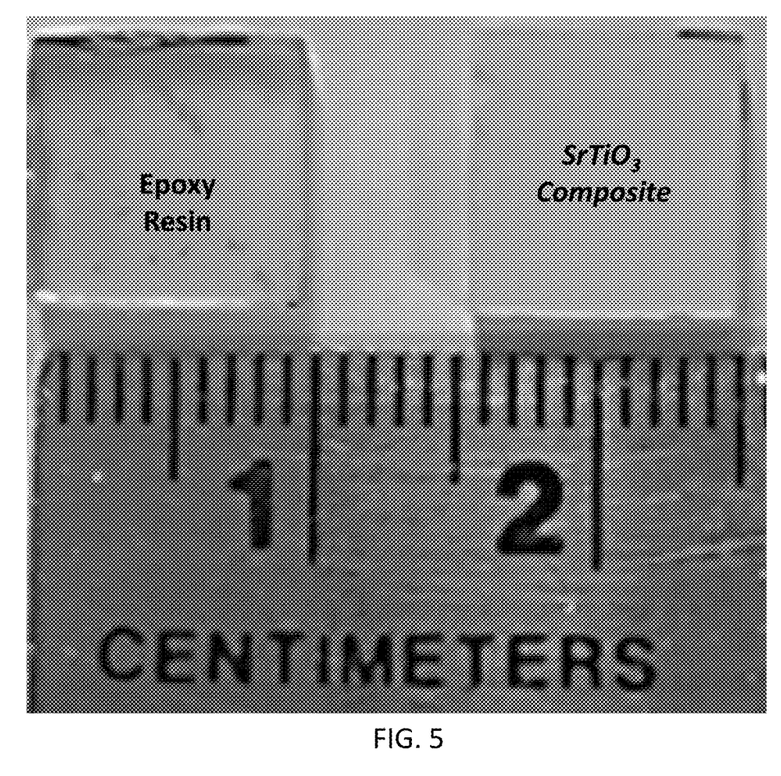
FIG. 5 is a schematic representation of composite structures, according to the present disclosure.

The composite samples were prepared by dispersion of $SrTiO_3$ particles of size below 5 μm (e.g., SIGMA ADLRICH). The dielectric particles were dispersed inside epoxy resin by between about 0%, 10%, 15%, 20%, and 30% volumetric ratio using a mixing method (e.g., Tip Sonication) for 1 hour with a pulse after every 2 s. After sonication, hardener was added to the mixture and composition was poured into a 3D printed mold to obtain composite sample of a thickness of about 4 mm. The mold was placed inside a vacuum chamber for about 15 mins to purge trapped air bubbles. The composite structure was then cured under vacuum heating for about 4 hrs. Thereafter, samples were machined to the final dimension of about 10 mm×about 10 mm×about 4 mm for compression experiments as shown in FIG. 5, which is a photograph of actual starting resin and the composite block as described above.

Figure 6:
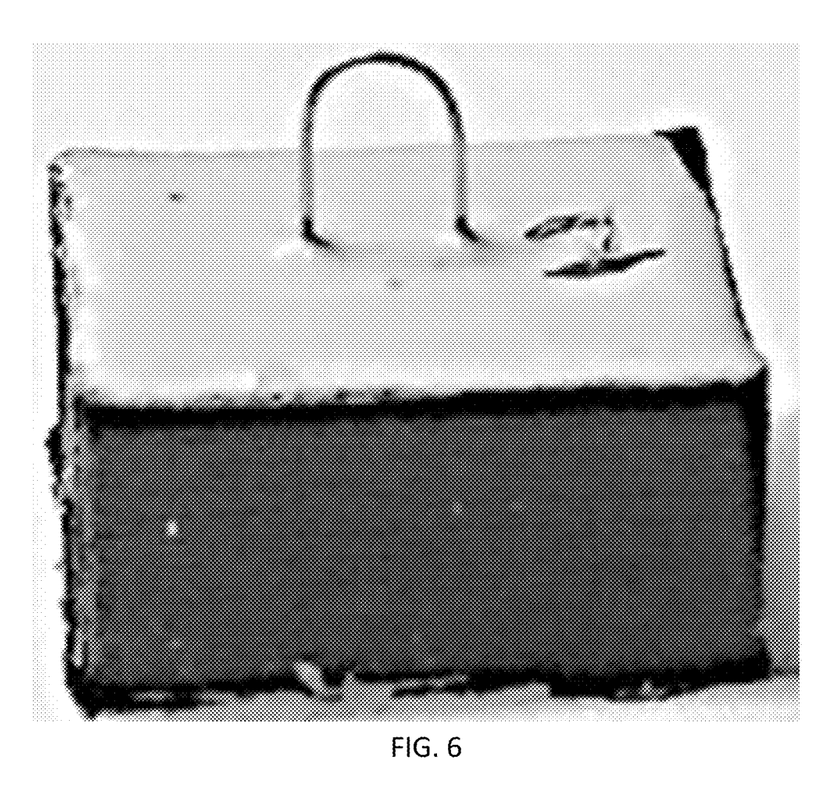
FIG. 6 is a schematic representation of a composite block, according to the present disclosure.

To generate a model based on Lichtenecker's mixing rule, a block of composite material according to the present disclosure was fabricated, as shown in FIG. 6. which is a photograph of a composite material prepared for testing according to the procedure discussed herein. As shown in FIG. 6, about 75% of the hairpin resonator was embedded inside the composite structure. Composite structures with different volumetric fraction of $SrTiO_3$ particles were examined to determine the dielectric constant using equation (2).

Figure 7:
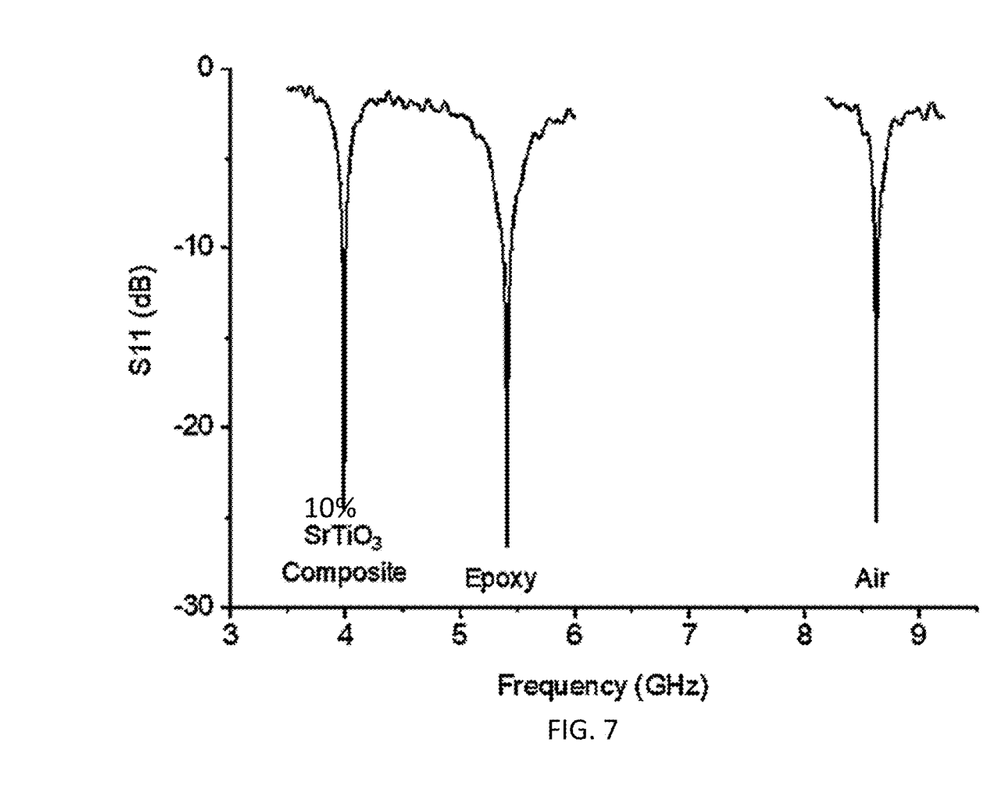
FIG. 7 is a graph of response vs. frequency for different types of medium.

Resonance frequency of the hairpin resonator is inversely proportional to the square root of the dielectric constant of composite. The resonance frequency of the hairpin was determined for air (i.e., no composite material), for the epoxy (i.e., no $SrTiO_3$) and 10% by volume $SrTiO_3$. Referring to FIG. 7, the results of the resonance frequency for these constructs are provided. Inspecting FIG. 7, it can be seen that the resonance frequency in air, epoxy resin and $SrTiO_3$ composite are about 8.63 GHz, about 5.41 GHz and about 3.99 GHz, respectively (Q-factor are 511, 170 and 228, respectively). The resonance frequency of the hairpin in air (measured from FIG. 7) according to Eq (2) is $$f_{r0} = \frac{c}{4L} \quad (4)$$

while in presence of composite the resonance frequency is $$f_r = \frac{c}{4L\sqrt{\varepsilon}} \quad (5)$$

The resonance frequencies with and without the composite material are related as $$f_r = \frac{f_{r0}}{\sqrt{\varepsilon}} \quad (6)$$

and thus dielectric constant of the composite is determined as follows:

$$\varepsilon = \left(\frac{f_{r0}}{f_r}\right)^2 \quad (7)$$

The dielectric constant for epoxy and $SrTiO_3$ composite calculated from Eq. (7) are 2.54 and 4.68, respectively.

Figure 8:
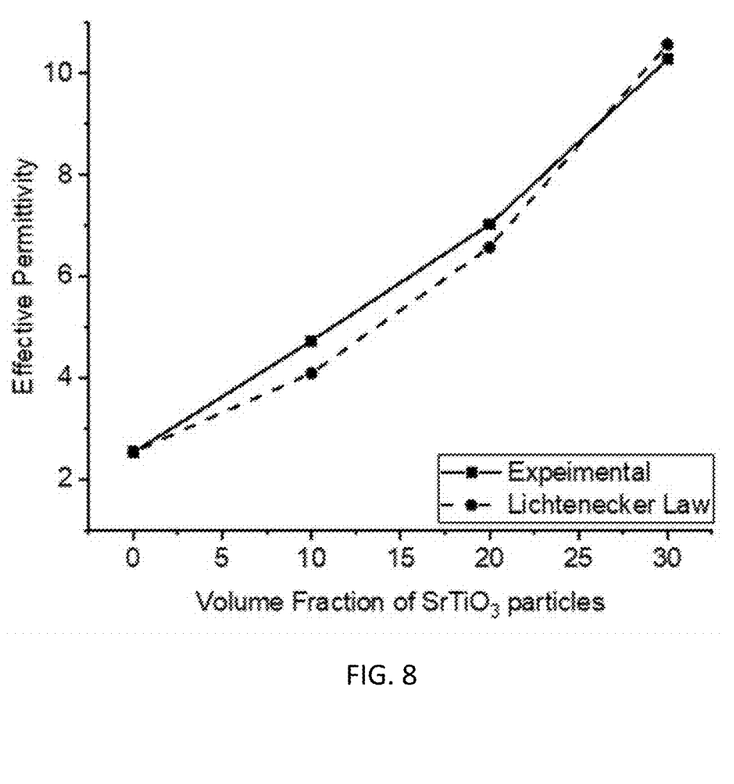
FIG. 8 is a graph of effective permittivity vs. volume fraction of particles, according to the present disclosure showing experimental results vs. theoretical results.

The temperature and pressure dependence of dielectric constants of these composites according to the present disclosure is advantageously used for wirelessly detecting stress and temperature change in the composites by detecting a change in dielectric permittivity of the Titanate particles embedded in composites. An example of this dependence is shown in FIG. 8, where a graph of effective permittivity vs. volume fraction of SrTiO₃ particles is provided. The dielectric constant of a composite increases with increasing quantity of particles having higher dielectric constant. The experimental data is consistent with Lichtenecker mixing rule (see equation (1)).

Figure 9:
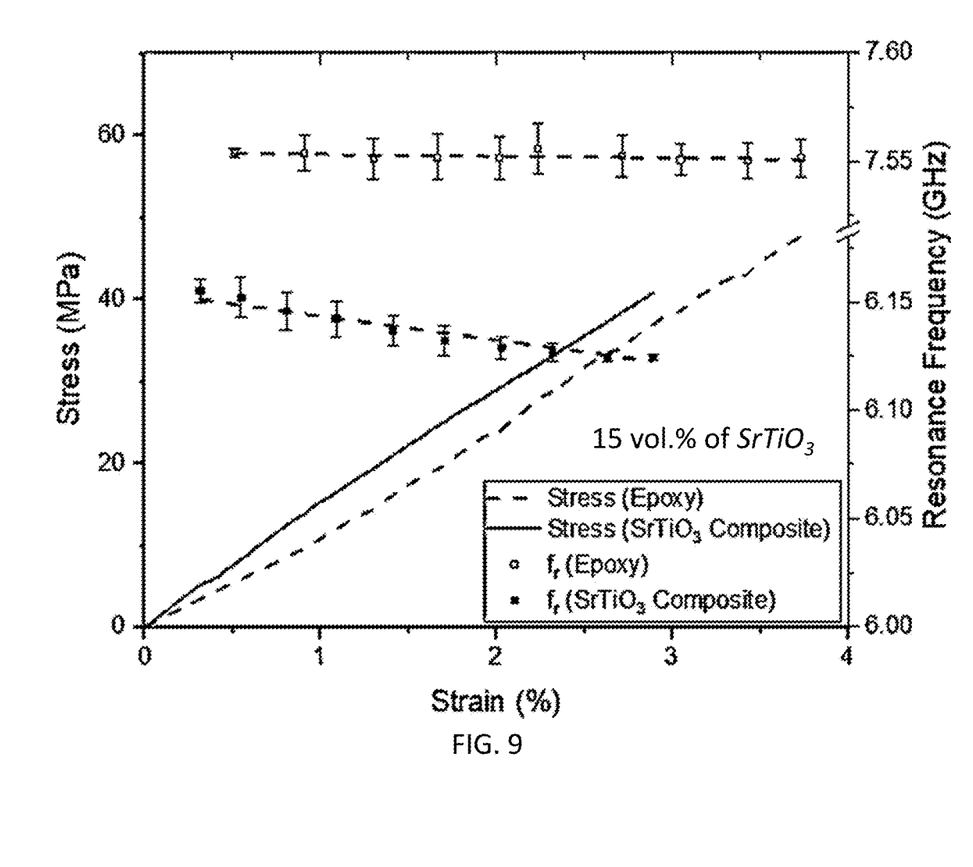
FIG. 9 shows graphs of stress vs. strain for different media, according to the present disclosure.

The effect of SrTiO₃ fillers on elastic modulus of epoxy resin-based composites can also be established as the elastic modulus of composite increases with increase in filler concentration, as shown in FIG. 9, where a graph of stress in MPa is shown vs. strain. Referring to FIG. 9, an increase in elastic modulus from about 1.257±about 0.025 GPa for epoxy alone to about 1.483±about 0.023 GPa for 15 vol. % of SrTiO₃ fillers is observed at a strain rate of about $8.3 \times 10^{-4}$/s. In addition to enhanced elastic modulus, SrTiO₃ composite show change in dielectric constant with stress. As shown in FIG. 9, the SrTiO₃ composites exhibits 0.5% decrease in resonance frequency compared to 0.02% decrease in epoxy resin, indicating increase in dielectric constant of SrTiO₃ composites under the application of uniaxial stress of 40 MPa. It should be appreciated that the dielectric constant of SrTiO₃ composites shows different behavior compared to bulk SrTiO₃ (not shown) where dielectric permittivity decreases with the increase of stress. This behavior in composite material indicates that change in dielectric constant due to deformation of composite matrix dominates the stress-induced change in dielectric behavior of SrTiO₃ particles. The compressive stress leads to increase of dielectric constant of composite because of increase in volumetric concentration of dielectric particles in the examined volume.

When a sensor with SrTiO₃ particles embedded therein is embedded in a structure, applied stress to the structure will be transmitted to the sensor and will cause change of the dielectric permittivity of the embedded microparticles. Changes in dielectric constant can be measured and stress magnitude can be determined based on prior calibration of the system. The dielectric response from micron-sized sensors inside composite material can be detected using the resonant frequency technique discussed above. The sensitivity is achieved due to the large absolute values of dielectric permittivity of particles ($\varepsilon_M$) compared to significantly smaller dielectric permittivity ($\varepsilon_p$) of the surrounding matrix.

Those having ordinary skill in the art will recognize that numerous modifications can be made to the specific implementations described above. The implementations should not be limited to the particular limitations described. Other implementations may be possible.

The invention claimed is:

1. A method of determining stress within a composite structure, comprising:
    coupling a sensor to a composite structure made of a non-electrically conducting material under load having embedded therein a plurality of particles, wherein the particles at room temperature are paraelectric or ferroelectric;
    transmitting an electromagnetic radiation to the sensor, thereby generating an electromagnetic field into the composite structure;
    sweeping frequency from a first frequency to a second frequency in a pulsed manner;
    receiving reflected power from the composite structure;
    determining the resonance frequency of the sensor; and
    translating the resonance frequency of the sensor to stress within the composite structure
    wherein the sensor is a hairpin resonator having a length L, and
    wherein the translation of the resonance frequency to stress within the composite is based on a predetermined stress-resonance frequency relationship associated with the composite material and the plurality of particles.

2. The method of claim 1, wherein the plurality of particles include one of Strontium Titanate, Barium Titanate and Lead Titanate, where Strontium Titanate is paraelectric at room temperature, and Barium Titanate and Lead Titanate are ferroelectric at room temperature.

3. The method of claim 1, wherein the plurality of paraelectric particles are at a concentration of between about 5% by volume to about 30%.

4. The method of claim 3, wherein the concentration by volume is one or more of 5%, 10%, 15%, 20%, and 30%.

5. The method of claim 1, wherein the first frequency is about 2 GHz, and the second frequency is about 6 GHz.

6. The method of claim 1, wherein the step of translating resonance frequency of the sensor includes:
    determining the effective dielectric of the composite structure, the effective dielectric of the composite structure affected by the dielectric of the plurality of particles which are affected by forces due to stress applied to the plurality of particles.

7. The method of claim 6, wherein the effective permittivity is governed by:

$$\varepsilon_{eff} = \varepsilon_p^v \cdot \varepsilon_m^{1-v}$$

where $\varepsilon_{eff}$ is the effective dielectric permittivity constant of the composite structure with the plurality of particles embedded therein, $\varepsilon_p$ is dielectric permittivity constant of the plurality of particles, $\varepsilon_m$ is dielectric permittivity constant of the composite structure without the plurality of particles, and v is volumetric fraction of the plurality of particles.

8. The method of claim 1, wherein the resonance frequency of the sensor is governed by:

$$f_r = \frac{c}{\left(4L\sqrt{\varepsilon_{eff}}\right)}$$

Where, c is speed of light, L is the length of the sensor, and $\varepsilon_{eff}$ is the effective dielectric permittivity constant of the composite structure with the plurality of particles embedded therein.

9. The method of claim 1, wherein modulus of elasticity of the composite structure increases by about 18% for about 15% by volume of the embedded plurality of particles.

10. The method of claim 1, wherein for Epoxy as the composite material and strontium titanate as the material of the plurality of particles, the predetermined stress-resonance frequency relationship is a linear relationship.

11. The system of claim 1, wherein for Epoxy as the composite material and strontium titanate as the material of the plurality of particles, the predetermined stress-resonance frequency relationship is a linear relationship.

12. A system for predicting stress within a composite structure, comprising:
an electromagnetic interrogation unit, including:
an electromagnetic transmitter, configured to provide electromagnetic radiation by sweeping frequency from a first frequency to a second frequency in a pulsed manner;
a resonance sensor, configured to receive the transmitted electromagnetic radiation and convey the received electromagnetic radiation into a composite structure made of a non-electrically conducting material under load, where the composite structure having embedded therein a plurality of particles, wherein the particles at room temperature are paraelectric or ferroelectric;
an electromagnetic analysis unit configured to i) receive reflected power from the composite, ii) determine the resonance frequency of the sensor, and iii) translate the resonance frequency of the sensor to stress within the composite structure, wherein the sensor is a hairpin resonator having a length L, and
wherein the translation of the resonance frequency to stress within the composite is based on a predetermined stress-resonance frequency relationship associated with the composite material and the plurality of particles.

13. The system of claim 12, wherein the plurality of particles include one of Strontium Titanate, Barium Titanate and Lead Titanate, where Strontium Titanate is paraelectric at room temperature, and Barium Titanate and Lead Titanate are ferroelectric at room temperature.

14. The system of claim 12, wherein the plurality of paraelectric particles are at a concentration of between about 5% by volume to about 30%.

15. The system of claim 14, wherein the concentration by volume is one or more of 5%, 10%, 15%, 20%, and 30%.

16. The system of claim 12, wherein the first frequency is about 2 GHz, and the second frequency is about 6 GHz.

17. The system of claim 12, wherein the electromagnetic analysis unit determines the effective dielectric of the composite structure to translate the resonance frequency of the sensor to stress within the composite structure, the effective dielectric of the composite structure affected by the dielectric of the plurality of particles which are affected by forces due to stress applied to the plurality of particles.

18. The system of claim 17, wherein the effective permittivity is governed by:

$$\varepsilon_{\mathit{eff}} = \varepsilon_p^v \cdot \varepsilon_m^{1-v}$$

where $\varepsilon_{\mathit{eff}}$ is the effective dielectric permittivity constant of the composite structure with the plurality of particles embedded therein,
$\varepsilon_p$ is dielectric permittivity constant of the plurality of particles,
$\varepsilon_m$ is dielectric permittivity constant of the composite structure without the plurality of particles, and
v is volumetric fraction of the plurality of particles.

19. The system of claim 12, wherein the resonance frequency of the sensor is governed by:

$$f_r = \frac{c}{\left(4L\sqrt{\varepsilon_{\mathit{eff}}}\right)}$$

Where, c is speed of light, L is the length of the sensor, and $\varepsilon_{\mathit{eff}}$ is the effective dielectric permittivity constant of the composite structure with the plurality of particles embedded therein.

20. The system of claim 12, wherein modulus of elasticity of the composite structure increases by about 18% for about 15% by volume of the embedded plurality of particles.

* * * * *